United States Patent [19]

Frazier

[11] 4,094,680
[45] June 13, 1978

[54] METHOD AND APPARATUS OF CHANGING CHARACTERS ON A FONT AND PREPARING A FONT DUPLICATE

[75] Inventor: Clifford John Frazier, Wilmette, Ill.

[73] Assignee: Castcraft Industries, Inc., Chicago, Ill.

[21] Appl. No.: 760,563

[22] Filed: Jan. 19, 1977

[51] Int. Cl.² ............................................. G03C 5/04
[52] U.S. Cl. ........................................ 96/41; 96/200; 96/43
[58] Field of Search ................... 96/41, 42, 43, 44, 200

[56] References Cited

U.S. PATENT DOCUMENTS 3,717,975  2/1973  Bloom .................................... 96/41

*Primary Examiner*—John D. Welsh
*Attorney, Agent, or Firm*—Howard B. Rockman; Larry L. Saret

[57] ABSTRACT

A film matrix is reproduced and altered by mounting a replacing image on a light transparent sheet over the image to be replaced on the film matrix. The image to be replaced is obliterated. The mounted replacing image and the film matrix are then double exposed on another piece of film to produce another film matrix with the replacing image appropriately inserted.

5 Claims, 13 Drawing Figures

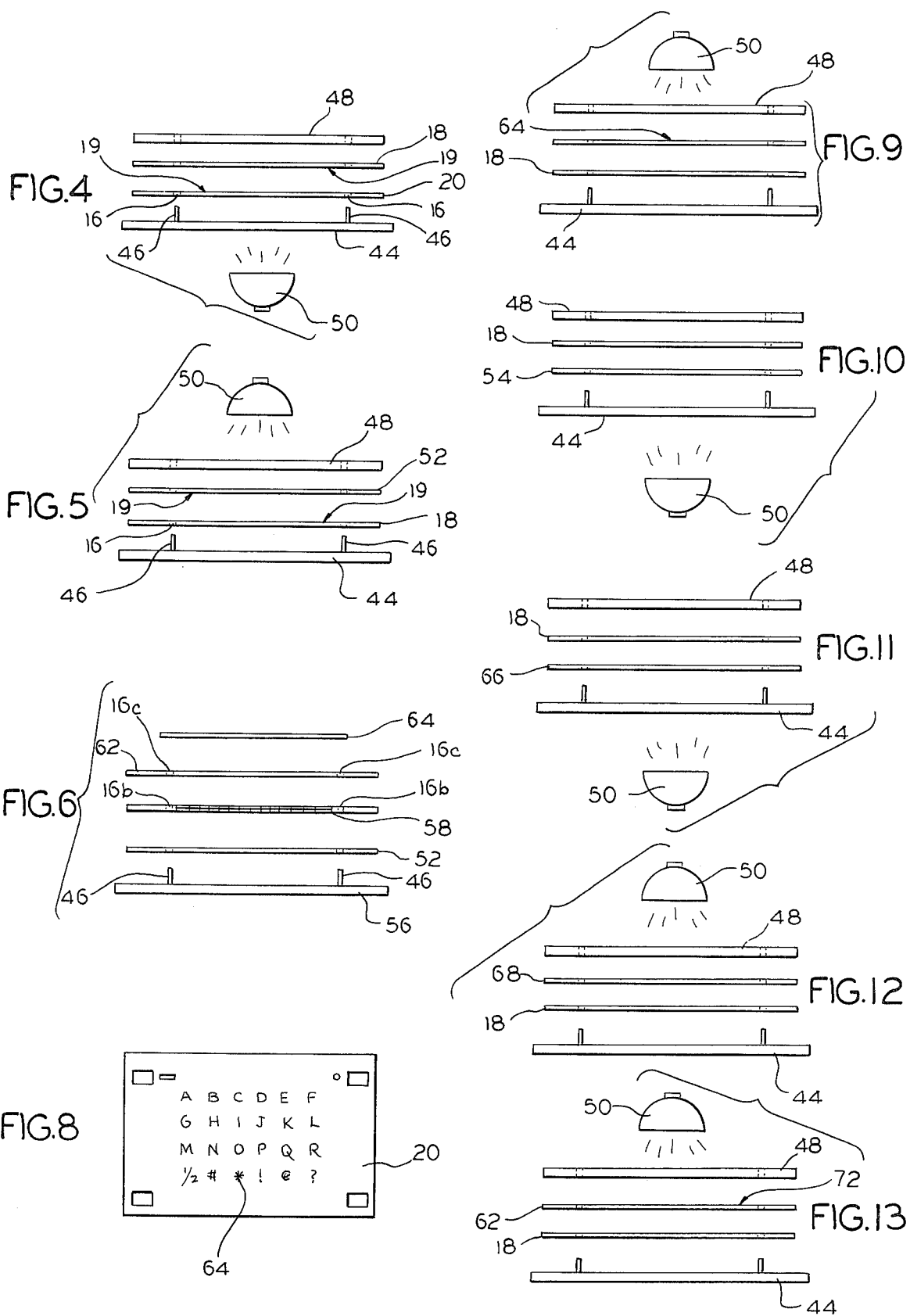

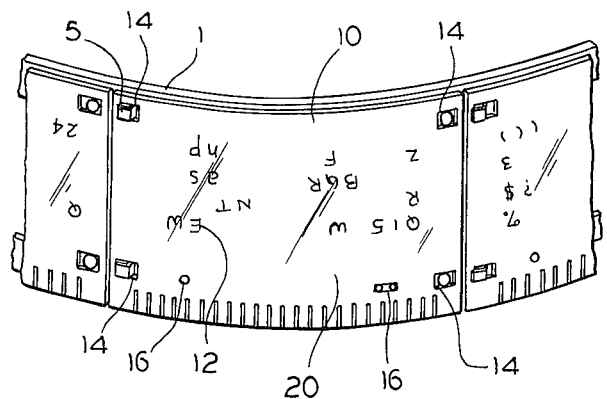
FIG.1
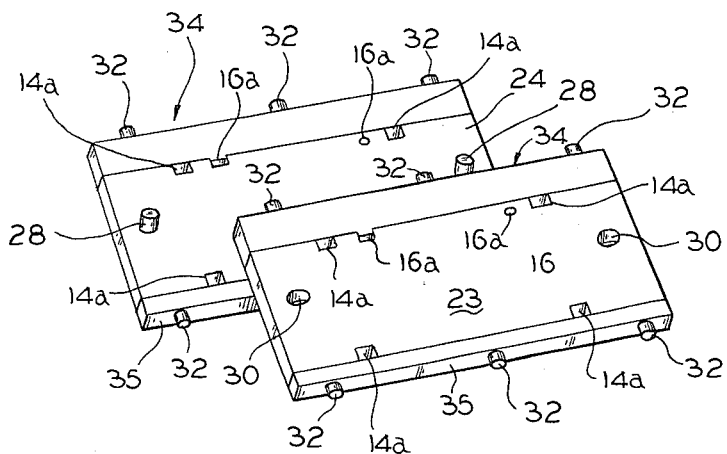
FIG.2
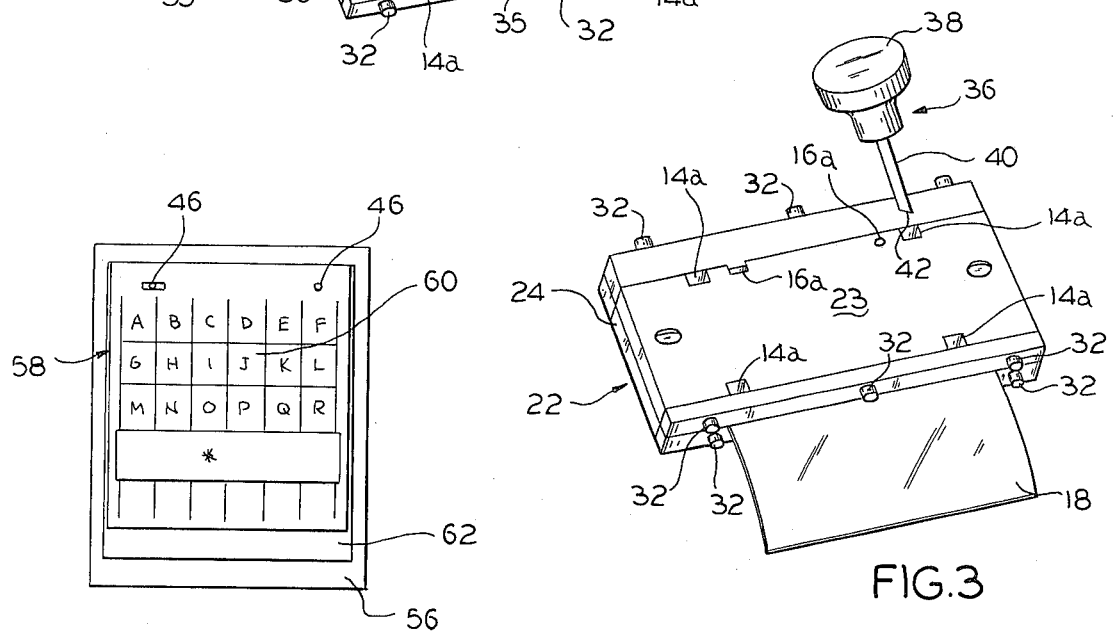
FIG.7
FIG.3

METHOD AND APPARATUS OF CHANGING CHARACTERS ON A FONT AND PREPARING A FONT DUPLICATE

This invention relates to film fonts or matrices and, more particularly, to methods for reproducing and altering these matrices.

A film font or matrix, as the term is used herein, is a piece of film which includes an assortment of lettering or type all of one size and style. The type on any one font may consist of letters, numerals and other characters, but they generally share some common traits in terms of physical appearance. In recent years, an entire industry called "phototypesetting" has developed which uses film fonts in the setting of text and headline type. Phototypesetter apparatus are available which set type by shining a narrow beam of light at a particular character on the film matrix and, since the matrix used is a negative, an image of the desired character is projected onto a light senstive paper behind the matrix. By adjusting the light to focus on any desired character, entire words and if desired, sentences can be printed. The light beam can be directed by a computer which is programmed to focus the light on each letter in a prescribed order.

Commonly, phototypesetters desire to display more than one particular style of type to their customers. In order to have quick and easy access to multiple fonts, phototypesetters often mount several fonts of different type styles at the periphery of a cylindrical drum, with the focusing light positioned at the axial center of the drum. In this manner, the drum can be rotated by a computer to position the desired character on a desired font in line with the beam of light.

Great care must be exercised to protect the original or master fonts used in such apparatus from dirt or scratches which would show up on the projected images of the characters. Nevertheless, during the process of mounting and dismounting the fonts from a drum, they are often and easily scratched by the drum or by fingernails. During transfer from storage to use, the fonts are also exposed to the dangers of scratches or dirt. For this reason, it is desirable to employ reproductions or duplicates of the original fonts during actual use to preserve the quality of the original font.

Duplication of these film fonts has created certain difficulties which standard photographic duplication techniques have not been able to completely avoid. For example, because of the precise alignment and spacing required between the characters, the master font must be kept very rigid with respect to the film on which it is to be exposed during the duplication process. Also, great care must be taken during the exposing process to prevent dust, scratches and fingerprints from smudging the master and thereby creating a defective reproduction. Rarely are duplicate fonts produced by today's process equal in quality to the originals. As a consequence, high quality duplicates have been expensive and difficult to obtain.

Additional problems have been encountered using prior art apparatus to alter a font by way of adding, deleting or substituting characters. One method used involves cutting away the undesired portion of the font and inserting a new character or characters cut from a different font or film. However, considering the normally small size of each character, this method has proved impractical because of the difficulty in matching the position of the inserted piece with the rest of the characters on the original film, and also results in the loss of the use of the original characters in these positions.

Accordingly, an object of the present invention is to provide a new and improved method of reproducing film matrices. A more particular object is to provide a method of duplicating film matrices which produces quality copies without damaging the original film matrix.

Another object is to provide a quick and inexpensive method of altering film matrices. In particular, a further object is to provide a method of adding, subtracting or substituting images on a film matrix without affecting or damaging the original matrix.

Yet another object is to provide a method for creating film matrices with special images to fit the diverse needs of a phototypesetter.

In keeping with one aspect of this invention, a master or first negative film matrix is mounted on an exposing jig with its light sensitive or emulsion side facing up. A piece of film with its emulsion side down is also mounted on the exposing jig on top of the first negative film matrix. A light transmissive cover is then placed on top of the film and the combination exposed by common photographic techniques. The result is a first positive film matrix exposed on the piece of film, which film contains the same images and format as the first negative film matrix. This process can then be repeated, however, this time using the first positive film matrix as a master in the jig, and placing a second piece of film with its emulsion side down in the jig over the positive "master". Exposure of this combination produces a second negative film matrix.

According to this invention, the second negative film matrix can then be easily altered to add, subtract, or substitute a character or image. For example, one character or image can be substituted for another on the second negative film matrix. This procedure involves placing the first positive film matrix on a stripping jig to hold it in a fixed position, and a light transparent sheet, such as acetate, is positioned above it, also in a fixed relationship to the first positive film matrix. A positive replacing image, that is an image taken from another positive film matrix acting as a source, can then be affixed onto the light transparent sheet directly over the image to be replaced. The light transparent sheet with the affixed replacing image is then exposed on film to produce a third negative film matrix which only contains the replacing image. The second negative film matrix is then treated with a photographically opaque substance over the image to be replaced, and this treated second film matrix is then double exposed on the same piece of film with the third negative film matrix. The result is a second positive film matrix with the replacing image inserted in the position of the obliterated image. Another exposure of the second positive film matrix produces a fourth negative film matrix which differs from the master or first negative film matrix only by the substitution of a single image.

The above mentioned and other features and variations of this invention and the manner of obtaining them will become more apparent, and the invention itself will be best understood by reference to the following description of particular variations of the invention taken in conjunction with the accompanying drawings, in which:

FIG. 1 is a perspective view of a portion of a drum with a font mounted thereon;

FIG. 2 is a perspective view of the punch guide;

FIG. 3 is a perspective view of the punch and punch guide as used in accordance with this invention;

FIG. 4 is a plan view of a particular font being exposed on a piece of film in accordance with this invention;

FIG. 5 is a plan view of another font being exposed on a piece of film in accordance will this invention;

FIG. 6 is a plan view of another font being exposed on a piece of film in accordance with this invention;

FIG. 7 is an elevational view of an image being aligned over a font;

FIG. 8 is an elevational view of a replacing image inserted onto a font;

FIG. 9 is a plan view of another font being exposed on a piece of film in accordance with this invention;

FIG. 10 is a plan view of another font being exposed on a piece of film in accordance with this invention;

FIG. 11 is a plan view of another font being exposed on a piece of film in accordance with this invention;

FIG. 12 is a plan view of another font being exposed on a piece of film in accordance with this invention;

FIG. 13 is a plan view of another font being exposed on a piece of film in accordance with this invention.

Referring to FIG. 1, there is shown a drum 1 securing one type of film matrix 10 which can be duplicated and altered according to the present invention. This matrix includes a series of characters of images 12, photographically produced thereon, four mounting holes 14 and two guide holes 16 in a piece of film approximately 3¼ inches in width by about 2⅜ inches in length. While this is a common size for film matrices used the phototypesetting industry, this invention can be used for any size film matrix with any format or type of image. For purposes of this description, FIG. 1 illustrates all of the film matrices described herein, both positive and negative, since they differ only in the particular images displayed thereon.

FIGS. 2 and 3 illustrate the apparatus used to prepare the film for exposure. In FIGS. 2 and 3, a metal punch guide 22 comprising a top portion 23 and a bottom portion 24 is provided which holds a piece of unexposed film 18 rigidly between the top and bottom portions 23 and 24. These portions each have four mounting holes 14a and two guide holes 16a. The bottom portion 24 also has two pegs 28 which fit into peg holes 30 in the top portion 23, thereby holding the two portions of the punch guide 22 in a fixed relationship. Knobs 32 protrude from the upper and lower edges 34 and 35 of the two portions of the punch guide to permit ease of handling and manipulation.

To duplicate a master or first negative film matrix 20, a piece of film 18 is cut to the same approximate width as the first negative film matrix 20. Any convenient length of film is sufficient, provided that it is at least as long as the first matrix 20. Clarity of the base film, sharpness of image and base thickness are three important factors to consider in choosing an appropriate film for purposes of this invention. For example, it has been found that Eastman Kodalith Ortho Film Type 3 Estar Base 0.007 #4556 has delivered high-quality film matrices under proper exposure conditions.

The film 18 can then be punched to provide the mounting holes 14 to secure the film matrix on the drum 1 for actual use, and guide holes 16, used primarily to hold the film during exposure. Conventionally, knobs or hooks 5 fixed to the drum 1 protrude through the mounting holes 14 and overlap the film matrix, thereby holding it secure. When a substantial number of master film matrices of the same size are to be duplicated, it is desirable to use a punch guide constructed to the same proportions, including properly positioned mounting and guide holes corresponding to the holes in the master film matrices.

In order to perforate the film 18 with mounting holes 14 and guide holes 16, a punch 36 is employed in conjunction with the punch guide 22. The punch 36 has a handle portion 38 and a blade portion 40.

The blade portion 40 is contoured to correspond in cross-section to the dimensions of the guide holes 16 or mounting holes 14 in the first negative film matrix 20, and of the holes 14a and 16a in the punch guide 22. It is also preferable that the leading edge 42 of the blade 40 be somewhat pointed for ease in perforating the film. The film 18 is then placed between the pegs 28 and the top and bottom portions 23, 24 of the punch guide. An adhesive tape may be applied to the film to hold it securely to the punch guide. By inserting the blade 40 of punch 36 into holes 14a and 16a of the punch guide 22, the film 18 can be quickly and easily perforated with holes corresponding to those in the first negative film matrix 20. Of course, a different punch 36 must be used for each shape of guide or mounting hole desired.

FIG. 4 illustrates how the first negative film matrix 20 is exposed to produce a positive. The matrix 20 is mounted on an exposing jig 44 with the emulsion side 19 of the matrix facing away from the jig. Jig 44 is made of a rigid, transparent material, such as clear plastic, which is free from scratches or other photographically deleterious defects on its surface. Upwardly extending guide pins 46 on jig 44 protrude through the guide holes 16 of the first negative film matrix. In similar fashion, the photosensitive film 18 with its emulsion side 19 down, and a jig cover 48, also composed of a transparent material, can be firmly positioned sandwich fashion on the exposing jig 44 and film matrix 20. This combination can then be photographically exposed to a light source 50 located opposite the exposing jig 44 as shown in FIG. 4. With the film type described earlier it has been found that 25 seconds exposure time in a vacuum frame using a tap-one light source produces good results. Exposure of this combination produces a first positive film matrix 52, (FIG. 5) virtually identical, but reversed, relative to the first negative film matrix 20.

This process is repeated to produce a second negative film matrix. As shown in FIG. 5, another piece of photosensitive film 18 with its emulsion side 19 facing upwardly is placed on the exposing jig 44, and the first positive film matrix 52 formed by the previous process is placed on top of the film, emulsion side 19 down. Jig cover 48 securely fastens the combination together. A similar exposure as before, except with the light opposite the cover 48, produces a second negative film matrix 54 which exactly duplicates the first negative film matrix 20.

Both film matrices 52 (positive) and 54 (negative) are then trimmed with a sharp knife or razor blade to the exact size of the first negative film matrix 20. It is also advisable to closely examine film matrices 52 and 54 for scratches or smudges. Desirably, matrices 20 and 54 should be placed on the phototypesetter simultaneously and the same images printed out to compare quality. If film matrix 54 is not of substantially equal quality with film matrix 20, it is advisable that the entire process be repeated with adjustments made to the light source or exposure time, and with greater care taken during exposure to avoid unnecessary smudging.

FIGS. 6 and 7 illustrate a method for altering a film matrix. Alteration, according to the present invention, includes adding, subtracting and substituting images on a film matrix. Commonly, it is desirable to insert a character or image from one negative film matrix called a source film matrix herein, onto another negative film matrix. In that case, a positive is made of the source negative film matrix with the identical procedure described above in relation to FIG. 4. The desired replacing image can then be cut from the source positive film matrix.

FIG. 6 shows how the replacing image 64 is appropriately positioned with respect to first positive film matrix 52. The first positive film matrix 52 is mounted on a stripping jig 56 also having guide pins 46. The emulsion side 19 of matrix 52 faces upward. On top of the matrix 52 is a grid 58 imprinted on a transparent plastic sheet. As shown in FIG. 7, each cell 60 of the grid should frame the top, bottom, and left side of one image of the positive film matrix 52. The grid 58 should also be punched with guide holes 16b corresponding to the guide pins 46. Another transparent plastic sheet 62, punched with guide holes 16c, is placed above the grid 58 on stripping jig 56. The replacing image 64 can now be properly positioned.

Using grid 58 to frame the top, bottom, and left side of replacing image 64, the replacing image is positioned on the plastic sheet 62 directly over the image to be replaced. In FIG. 7, the replacing image is shown as an asterisk. The replacing image 64 is then affixed to the plastic sheet 62 as with an adhesive tape. Then, following the procedure described in relation to FIG. 5, (see FIG. 9), the plastic sheet 62 containing the replacing image 64 is exposed on another piece of film 18 to produce a third negative film matrix 66. Any images other than replacing image 64 on sheet 62 are covered with a photographically opaque substance before exposure.

Returning to the second negative film matrix 54, the image to be replaced is covered with a photographically opaque substance. Using the procedure described in relation to FIG. 4, the second negative film matrix 54 and the third negative film matrix 66 are successively exposed on the same piece of film 18 to produce a second positive film matrix 68 containing the replacing image 64 in the position of the replaced image (see FIGS. 10 and 11). By again repeating the procedure described in relation to FIG. 5 (see FIG. 12), a fourth negative film matrix 70 is produced which differs from the first negative film matrix only in the substitution of an asterisk for the hyphen. See FIG. 8. Obviously, multiple images can be substituted in the same manner as a single image as described herein.

The above-described procedure has been found most convenient for the situation where a first image on a source negative film matrix is to be substituted for a second image on another negative film matrix, without permanently changing the source negative film matrix. Of course, if it is unnecessary to preserve the source negative film matrix, the replacing image can be cut directly from it, thereby eliminating the step of making a duplicate positive from the source film matrix. However, it has been determined that the visual problem of aligning a negative replacing image is considerably more difficult than aligning a positive replacing image.

It is also possible, according to the present invention, to either simply remove an image from a film matrix or, alternatively, to insert an image onto a blank portion of a film matrix.

Image removal can be accomplished by covering the image to be removed from the second negative film matrix 54 with a photographically opaque substance, exposing matrix 54 on film 18 to produce a second positive film matrix 68, and finally exposing matrix 68 to produce a final negative film matrix which duplicates the master negative film matrix except for the removal of the image. Of course, the exposure of matrices 54 and 68 is accomplished as described in reference to FIGS. 10 and 12 above.

Image insertion is also relatively easy according to this invention. Sometimes, the master or first negative film matrix 20 has blank space where another image could be easily inserted. In that case, an inserted image 72 can be positioned on transparent plastic sheet 62 over the blank space, exposed on film to produce a second negative film matrix 54, (see FIG. 13), and then matrix 54 can be double exposed on film with matrix 20, (see FIGS. 4 and 10), to produce a second positive film matrix 68 which has the inserted image 72 in the previous blank space. Exposure of matrix 68 produces a negative film matrix which can be used in the phototypesetter (see FIG. 12).

The many advantages of this method of changing film fonts or matrices are self-apparent. First, the master matrix need not be permanently changed in order to add, subtract or substitute images thereon. Second, the images of two or more matrices can be combined in a new matrix uniquely suited to the needs of each phototypesetter. Third, the method is quick, easy, and relatively inexpensive compared with previous methods for producing film matrices. Fourth, this method requires a minimal amount of new and inexpensive equipment for the average phototypesetter. Fifth, this method permits the owner of the film matrices to inventory only those images that are needed, and to be allowing flexibility in future requirements.

While the principles of the invention have been described above in connection with specific apparatus and applications, it is to be understood that this description is made only by way of example and not as a limitation on the scope of the invention.

I claim:

1. A method for altering an image including one or more characters located anywhere on a first negative film matrix, under controlled conditions, comprising the steps of:
   a. exposing the first negative film matrix on film to produce a first positive film matrix which is an exact duplicate;
   b. exposing the first positive film matrix on film to produce a second negative film matrix;
   c. overlaying a grid on the first positive film matrix;
   d. overlaying a light transparent sheet over said grid;
   e. positioning and mounting a replacing image on the light transparent sheet within the desired cell of said grid over the image to be replaced;
   f. exposing the mounted replacing image on film to produce a third negative film matrix;
   g. covering the image to be replaced on the second negative film matrix with a photographically opaque substance;

h. double exposing both the second and third negative film matrices on the same film to produce a second positive film matrix;

i. exposing the second positive film matrix to produce a fourth negative film matrix which has the replacing image in the position of the replaced image.

2. The method of claim 1 wherein step e. includes the preliminary steps of exposing a source negative film matrix containing the replacing image on film to produce a source positive film matrix; and cutting the replacing image from the source positive film matrix.

3. A method for reproducing and altering a first film matrix having images including one or more characters located anywhere thereon, comprising the steps of:

a. mounting said first film matrix on a jig;
   b. mounting a positioning guide having cells of the approximate size of a single character on said jig over said first film matrix;
   c. mounting a light transparent sheet on said jig over said positioning;
   d. aligning a replacing image within one or more cells of said positioning guide in the desired location over said first film matrix and fixing said replacing image to said light transparent sheet; and
   e. double exposing said replacing image and said first film matrix on film to produce a film matrix which includes said replacing image inserted precisely in the desired location with respect to the other images on said first film matrix.

4. A method according to claim 3 including the ability to substitute images, wherein the image to be replaced on the first film matrix is obliterated before exposure.

5. A method according to claim 3 wherein step (b) comprises overlaying a grid on said first film matrix, and wherein step (d) comprises aligning a replacing image on said light transparent sheet within the desired cell of said grid and fixing said replacing image to said light transparent sheet.

* * * * *